United States Patent [19]

Kroger et al.

[11] 3,761,783

[45] Sept. 25, 1973

[54] DUEL-MESA RING-SHAPED HIGH FREQUENCY DIODE

[75] Inventors: Harry Kroger, Sudbury; Curtis N. Potter, Holliston, both of Mass.

[73] Assignee: Sperry Rand Corporation, New York, N.Y.

[22] Filed: Feb. 2, 1972

[21] Appl. No.: 222,771

[52] U.S. Cl.. 317/234 R, 317/235 AJ, 317/235 AK, 317/234 M, 317/234 A, 29/589

[51] Int. Cl. ............................ H01l 3/00, H01l 5/00

[58] Field of Search ..................... 317/235, 47, 47.1, 317/234, 1, 5.3; 29/589

[56] References Cited

UNITED STATES PATENTS

| | | | |
|---|---|---|---|
| 2,973,466 | 2/1961 | Atalla et al. | 317/234 |
| 3,201,664 | 8/1965 | Adam | 317/235 |
| 3,283,218 | 11/1966 | Goldman et al. | 317/235 |
| 3,457,471 | 7/1969 | Moroney et al. | 317/235 |
| 3,487,272 | 12/1969 | Siebertz et al. | 317/235 |
| 3,516,017 | 6/1970 | Kaneko et al. | 317/234 |

OTHER PUBLICATIONS

Improved Performace of Silicon—on Diamond Heat Sinks, Proceedings of the IEEE, Sept. 1967, pages 1617 & 1618

LSA Diodes; Electronics, Feb. 1969, pages 54 and 66.

Edge Breakdown in Mesa Diodes; IEEE Transactions, pages 844 to 848 Oct. 1971.

*Primary Examiner*—John W. Huckert
*Assistant Examiner*—Andrew J. James
*Attorney*—Howard P. Terry

[57] ABSTRACT

High frequency diodes are manufactured by methods in which extended dual means are formed upon semiconductor or other substrates, one mesa incorporating the active junction and another supporting the active mesa in reduced parasitic capacitive relation, with the substrate supporting the combination of mesas and with an efficient heat sink cooperating with the active mesa. Novel ring shaped diodes made according to the method feature a high degree of circular symmetry and therefore freedom from burn out, thermal compression bonding being used to perfect the bond between the active mesa and a diamond heat sink. Symmetry of the diode is assured by use of a photoresist mask generation technique employing a reduced rate of evaporation of the photoresist solvent.

7 Claims, 28 Drawing Figures

DUEL-MESA RING-SHAPED HIGH FREQUENCY DIODE

The invention herein described was made in the course or under a contract or subcontract thereunder with the United States Air Force.

BACKGROUND OF THE INVENTION

1. Field of the Invention

The invention pertains to long and thin or ring shaped high frequency or microwave semiconductor diode devices of the type suitable for use as active elements at increased power levels in microwave amplifiers and oscillators and to methods of manufacture of such diodes. The invention more particularly relates to microwave diodes having ring shaped active junctions supported upon concentrically disposed mesas supported, in turn, on a substrate and supporting from the active junction mesa an efficient heat sink.

2. Description of the Prior Art

Generally, prior art high frequency diodes with extended active junctions expected to permit relatively high power operation in microwave amplifiers or oscillators, such as high efficiency mode oscillators, have suffered from various deficiencies. The nature of such high efficiency mode circuit devices imposes serious demands upon the diode devices used in them. The operating requirements thus imposed have been discussed in the generally available literature and in the M.I. Grace U.S. Pat. application Ser. No. 17,673 for a "Semiconductor Diode High Frequency Signal Generator," filed Mar. 9, 1970 issued Feb. 29, 1972 as U.S. Pat. 3,646,581, in the M.I. Grace U.S. Pat. application Ser. No. 23,130 for a "Semiconductor Diode High Frequency Signal Generator," filed Mar. 27, 1970 issued Feb. 29, 1972 as U.S. Pat. No. 3,646,357, in the M.I. Grace, H. Kroger, and H.J. Pratt U.S. Pat. application Ser. No. 102,738 for a "Broad Band High Efficiency Mode Energy Converter", filed Dec. 30, 1970, and in other pending Sperry Rand patent applications.

A further and primary limitation has been connected in the prior art with the need greatly to improve heat dissipation from the active junctions of high frequency diodes. While attempts have been made in the past to fabricate long, thin microwave diodes and circular or ring shaped diodes, lack of perfect forming and bonding of the junctions has hindered efficient heat removal from the diode and has not permitted reliably efficient circuit operation. Attempts to reduce undesired parasitic capacitive effects by deeply etching the devices have yielded fragile and unsymmetric devices, the lack of symmetry promoting burn out at lower than desired operating power levels and making perfect thermal compression bonding of the active junction to a heat sink difficult to attain.

SUMMARY OF THE INVENTION

The present invention relates to high frequency diodes especially of the type for efficient operation in high efficiency mode diode circuits, including extended or ring shaped junction devices for operation at increased microwave power levels, and to methods of manufacture of such diode devices. In the circularly symmetric form of the novel diode, a ring shaped active junction is supported by an active mesa formed upon a second or larger mesa having a configuration for reducing parasitic capacity effects, the concentrically disposed mesas being supported on a substrate formed integrally with the second mesa from semiconductor material or alternatively formed of an electrically conducting material such as gold. A diamond heat sink is bonded by a novel thermal compression bonding process to the junction formed in the active mesa. The inventive diode is made by a novel succession of dopant diffusion, metal plating, masking, etching, and thermal compression bonding steps, as will be further described.

DESCRIPTION OF THE PREFERRED EMBODIMENTS

Figure 1:
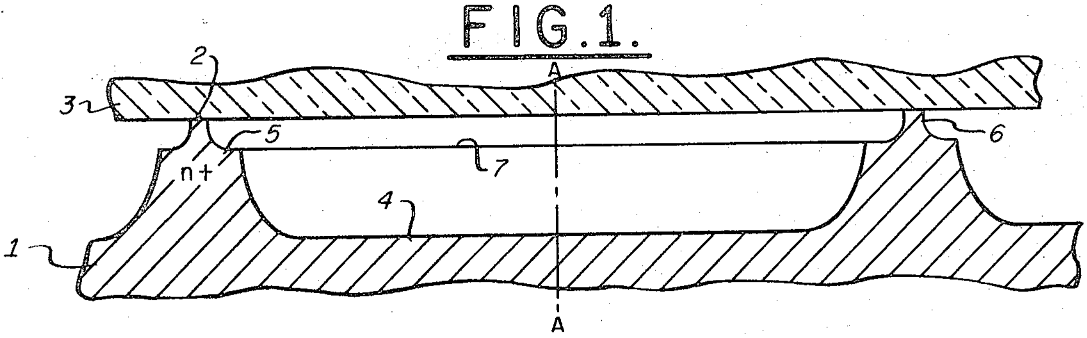
FIG. 1 is an elevation view in cross section of a preferred form of the novel diode.

The invention is a high frequency semiconductor TRAPATT or trapped plasma avalanche triggered transit diode device of the novel kind shown generally in FIG. 1, which cross section view of the diode does not show certain details yet to be discussed and that are so small in scale as to be incapable of recognition in the figure. In FIG. 1, it is seen that the diode includes a main body or substrate 1 of silicon or other semiconductor material. As illustrated, the diode device has circular symmetry about an axis A—A so that the current-conducting junction 2 between body 1 and heat sink 3 is circular or ring-shaped. Projecting toward heat sink 3 from the surface 4 of body 1 is a first annular mesa 5 which desirably provides reduced capacitance between body 1 and heat sink 3, which latter may be made of copper, gold, or diamond. Projecting in turn from the ring-shaped face of mesa 5 is a second annular mesa 6 which carries the active circular or ring-shaped junction 2 of the diode. In a representative circular form of the device, the diameter of the annular or ring-shaped bonding surface at junction 2 is about 0.05 centimeters, while the separation between surface 4 and heat sink 3 is about 50 microns. Thus, it will be seen that these and other parts of the novel high frequency diode are of correspondingly small size. Removal of the line 7 in FIG. 1 will aid the understanding that long, thin or lineal diodes may be made according to the invention as would be represented by generation of a figure of translation from the cross section shown in FIG. 1, and as will be further indicated in the discussion to follow which generally applies to novel diodes of either type.

A representative enlarged view of the active mesa 6 (again not shown to exact scale) of the diode in seen in FIG. 2 where it is again shown that the active diode mesa 6 projects from a face of the capacitance-reducing mesa 5 in order to make extended conductive contact at junction 2 with heat sink 3 in a manner providing a high heat dissipation capability. A main part of the active mesa 6 may, for example, be composed of type N+ silicon with successive overlying layers 9 and 10 respectively of N silicon and type P silicon. Layer 11 will be made of chromium of a thickness on the order of 50 to 100 Angstroms. The top or bonding layer 12 will be made of a highly conducting metal such as gold, being about 3,000 Angstroms in thickness. Overlying the body of the heat sink 3 is a first thin layer 14 of chromium on which is placed a relatively thicker layer 13 of a conducting metal such as gold or silver. The height of the total active mesa element 6 may be of the order of 16 microns and its thickness 8 microns. In a representative case, the total active area of the ring contact or junction 2 is of the order of $10^{-4}$ square centimeters.

According to the invention, it is preferred to fabricate the ring shaped junction 2 by a novel process such that the total thicknesses of the flat metal layers thus to be joined by thermal compression bonding need be made only 0.2 microns thick or considerably less, as opposed to the prior practice in which such metal layers of thicknesses greater than 12 microns were required. In this discussion, the term thermal compression bonding is taken to mean a process for fabricating a robust permanent bond between two metal surfaces, simultaneously using heat and pressure without melting either metal surface. The bond which results is formed by solid state diffusion, for example, of atoms from gold layer 12 into gold layer 13 and vice versa under very high pressure and at a moderately elevated temperature, as will be further described. Suitable bonds may be also made between silver layers 12 and 13, or one layer may be silver and the other gold. Using the inventive method, fully adequate bonds may be made between metal layers as thin as 3,000 Angstroms.

According to the invention, ring-shaped or long, thin active diode elements are generated, since they possess superior thermal dissipation properties because of their small thermal spreading resistance and more uniform temperature of operation. It is preferred in the present invention in the instance of ring-shaped diodes for microwave applications demanding wide band amplifier performance to use very large values of the ratio of circumference to ring width. Such ring-shaped and long, thin diodes have the virtues of maintaining uniform current density and of demonstrating low thermal impedance.

The design, for instance, of the novel ring diode for performing efficiently in a high frequency or microwave oscillator requires that additional physical principles be considered. The total area A of the ring-shaped junction must be too great. The capacitive reactance $X_c$ of the diode device must be greater than 1 to 10 ohms at the operating wave length:

$$X_c = W/\omega\epsilon A$$

where:

$W$ = width of the depletion layer of the diode, $\omega$ = frequency of operation in radians per second, and $\epsilon$ = dielectric constant of the semiconductor material.

Furthermore, there is for a given operating frequency, a maximum value of the circumference C of the ring. If the ring is large enough, standing waves of a frequency equal to the fundamental oscillation frequency or to a harmonic thereof can be set up around the ring. Such oscillations will generally not couple properly to the oscillator circuit and the device may not deliver useful power to a load. Such spurious signals are undesired, since the diode must support within its associated circuit in a predetermined manner several harmonics of the fundamental oscillation frequency in a manner discussed in the above mentioned M.I. Grace patent applications and elsewhere.

Figure 2:
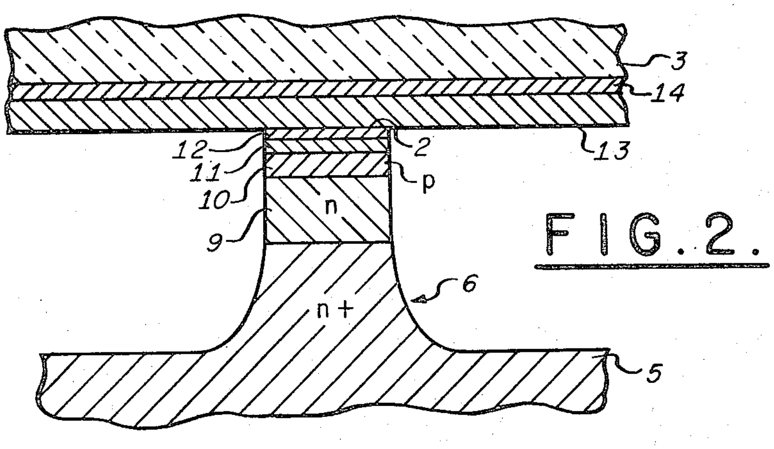
FIG. 2 is an enlarged elevation view in cross section of a portion of FIG. 1.
Figure 3:
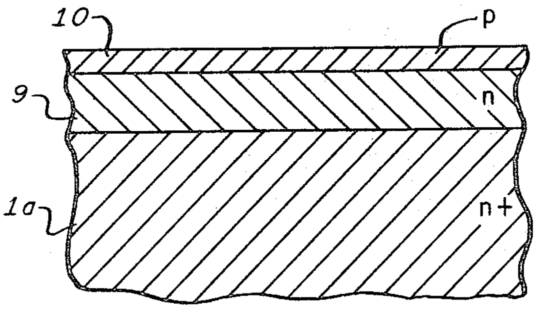
FIGS. 3 to 11 are views similar to FIG. 2 for use in explaining the method of making the mesas of FIGS. 1 and 2.
Figure 4:
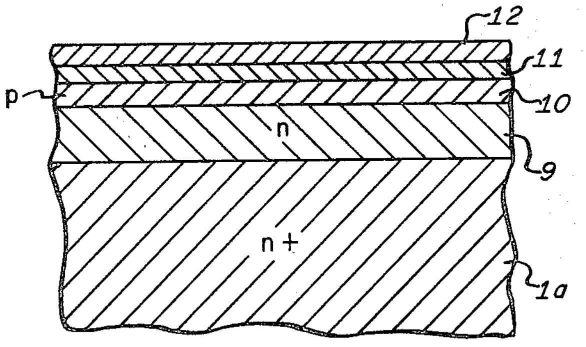

The manufacture of the novel diode of FIGS. 1 and 2 is begun as in FIG. 3 by operating upon a silicon body 1*a* of the N+ type having a type N epitaxial layer by forming layers 9 and 10. The process begins by the use of a conventional method of diffusing boron into the epitaxial layer to form the type P surface layer 10. Two metal layers 11 and 12 are added as in FIG. 4 at the surface of type P layer 10. A thin layer 11, preferably of chromium, is first formed by a conventional vacuum evaporation or sputtering process on type P layer 10. Layer 11 may be on the order of 50 to 100 Angstroms thick and acts to form a firm bond to the semiconductor material of layer 10. A gold layer 12 is next formed, again by evaporation or sputtering, of a thickness of the order of 3,000 Angstroms, being firmly bonded to chromium layer 11.

Figure 7:
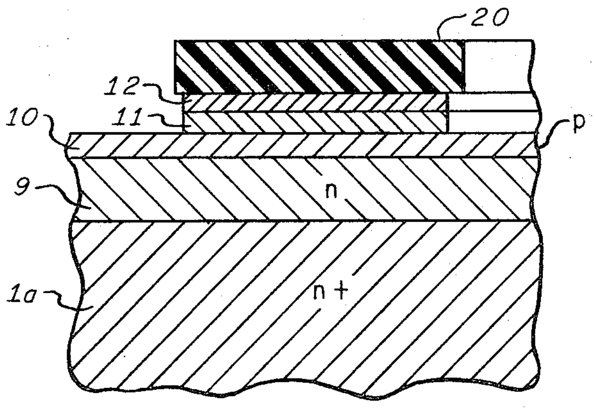

Succeeding novel steps in the method generate the preferred double mesa form of the invention as illustrated in FIGS. 1 and 2. The double mesa is formed in a dual step etching process that permits the fabrication of a semiconductor device which is mechanically strong and provides a ring diode structure having low parasitic capacitance. In the sequence, the larger or capacitance reducing mesa 5 of FIG. 1 is first formed, then the active, smaller mesa 6 of FIG. 2 is formed on a top surface of the larger mesa 5. To form mesa 5, a masking ring of photoresist 20 is applied in a conventional manner to the surface of gold layer 12, as in FIG. 5. Where layer 12 consists of gold, a conventional gold etchant is used, as in FIG. 6, to remove the gold layer except for a uniform ring layer 12 underlying photoresist ring 20. Next the chromium layer 11 is removed in a similar manner using a suitable chromium etchant, leaving the structure in the form shown in FIG. 7. The annular or ring-shaped metal layers 11 and 12 are now of substantially the same shape, the photoresist layer 20 having been used in the usual manner as a mask for the several metal etching processes. Only by leaving the photoresist layer 20 in place during the successive etching steps can the metal layers 11 and 12 be formed into regular rings as illustrated in FIG. 7 and in succeeding figures.

Figure 10:
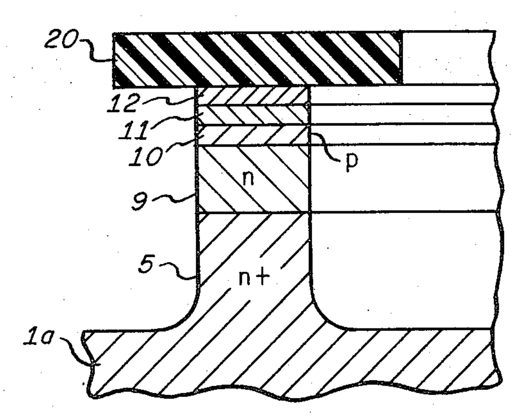
Figure 8:
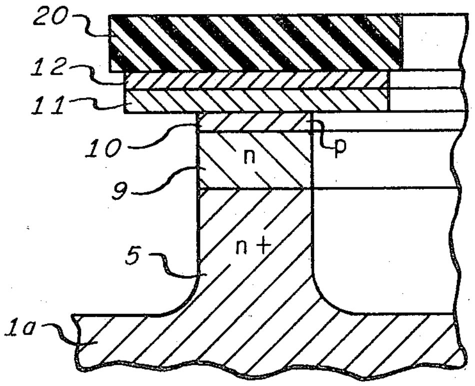
Figure 11:
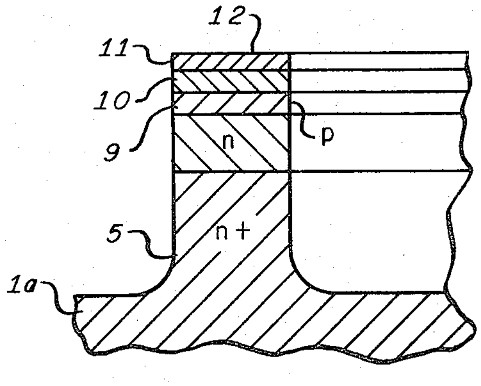
Figure 9:
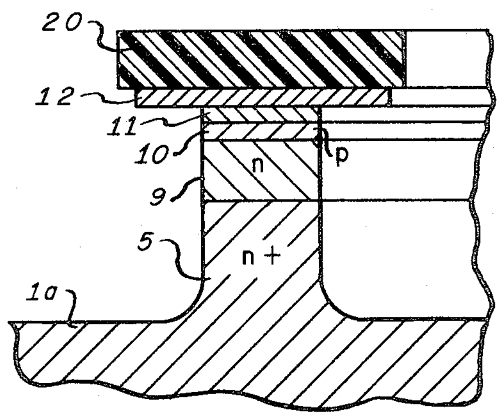

In a succeeding step after layers 11 and 12 are formed into rings, the silicon body 1*a* is deeply etched as in FIG. 8 by a conventional etching process to form the large mesa 5, undercutting silicon from beneath the chromium ring layer 11. In a next succeeding step, the chromium layer 11 overlying type P layer 10 is removed by use of a conventional chromium etchant (FIG. 9); a gold etchant is then used similarly to shape ring layer 12 as in FIG. 10. The completed mesa 5 is shown in FIG. 11, with the ring shaped gold layer 12 exposed by conventional removal of photoresist 20 and ready for thermal bonding after the second or active mesa 6 is formed upon it. The second chromium and gold etches producing the structures of FIGS. 9 and 10 are conventional with the exception that they are performed under conditions of vigorous agitation of the etchant, as overhang of metal layers 11 and 12 is to be avoided. To ensure that the etchant fluid washes adequately in and out of the narrow corner regions associated with mesa 5 and layers 11 and 12, the required agitation is supplied by a standard ultrasonic cleaner apparatus in which the etchant vessel is placed.

Figure 16:
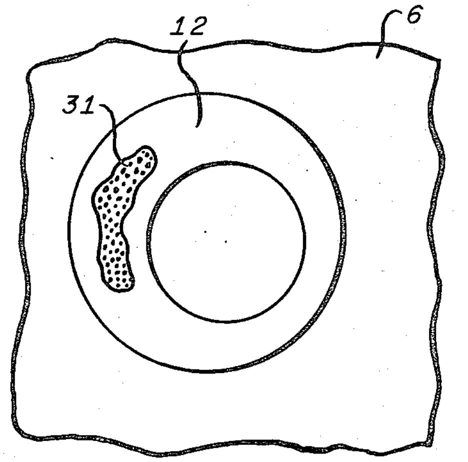
FIG. 16 is a plan view related to that of FIG. 14 again useful in explaining the novel photoresist application method.

Having described construction of the capacitance reducing mesa 5 of the novel diode, attention is now turned to the cooperating second or active mesa 6 yet to be formed. A novel method is employed for ensuring that the active mesa 6 will be of extremely uniform width. Such is accomplished in making the mesa 6 by using a first step providing an unusually even and extremely symmetric application of photoresist material 30 on top of the capacitance reducing mesa 5, as in FIG. 15. It is to be understood that the internal structure of mesa 5 is not shown in FIGS. 14 and 15 as a matter of convenience. An uneven photoresist layer 30 as in FIG. 14 can cause the width of the active mesa 6, yet to be formed, to vary widely and the mesa to be asymmetric, as in FIG. 16. Such uneven layers are commonly produced by prior art means when the object covered with photoresist is spun dry about an axis eccentric to the center of the object.

It is necessary for the active mesa 6 yet to be formed to have a very uniform width in order to produce uniform thermal compression bonds. For example, when diodes having mesas with non-uniformity on the order of 25 percent are exposed to breakdown tests, they fail at relatively low test voltages, burn out destruction in the active junction consistently appearing at the widest portion of the junction, as at location 31 in FIG. 16. The ring 12 thus being asymmetric, local compression bonding pressure is diminished in area 31, and the device ultimately fails in area 31.

Figure 14:
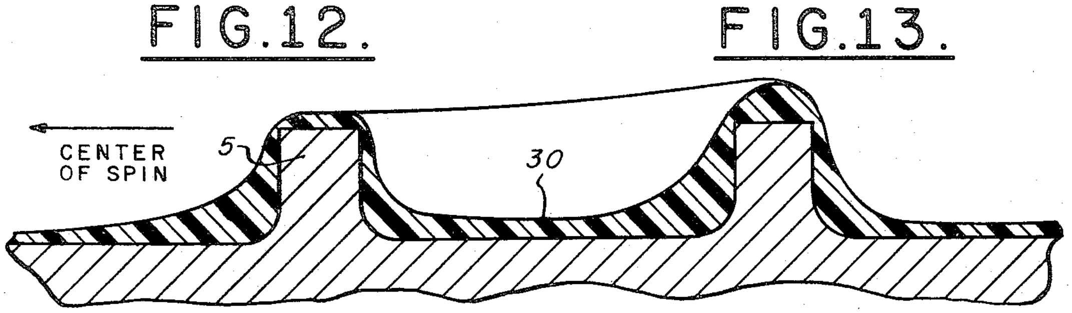
FIGS. 14 and 15 are cross section elevation views corresponding to a portion of FIG. 1 that are useful in explaining the novel photoresist application method.

Photoresist spun onto the semiconductor body as in FIG. 14 by the usual methods, that is, by covering the semiconductor body completely with a layer of photoresist fluid then spinning off the excess fluid, dries in the irregular form of FIG. 14 because of the centrifugal force exerted on the fluid and the effects of surface tension at the edges of mesa 5, the capacitance reducing mesa. Furthermore, the photoresist solvent evaporates in seconds, leaving the resist material frozen in the undesirable distribution shown.

Figure 15:
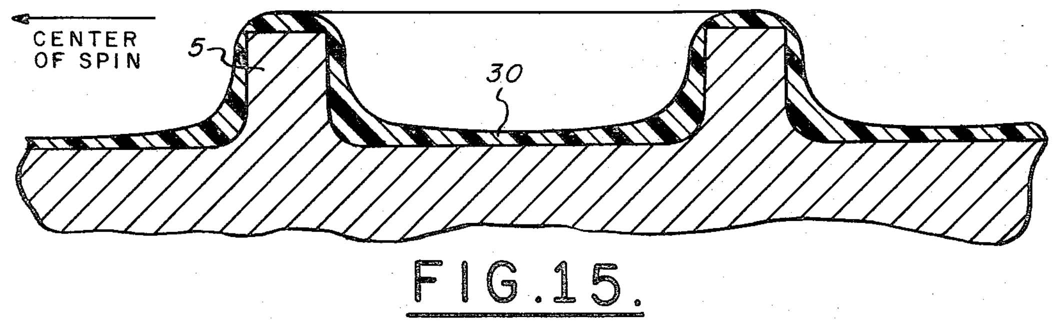
Figure 17:
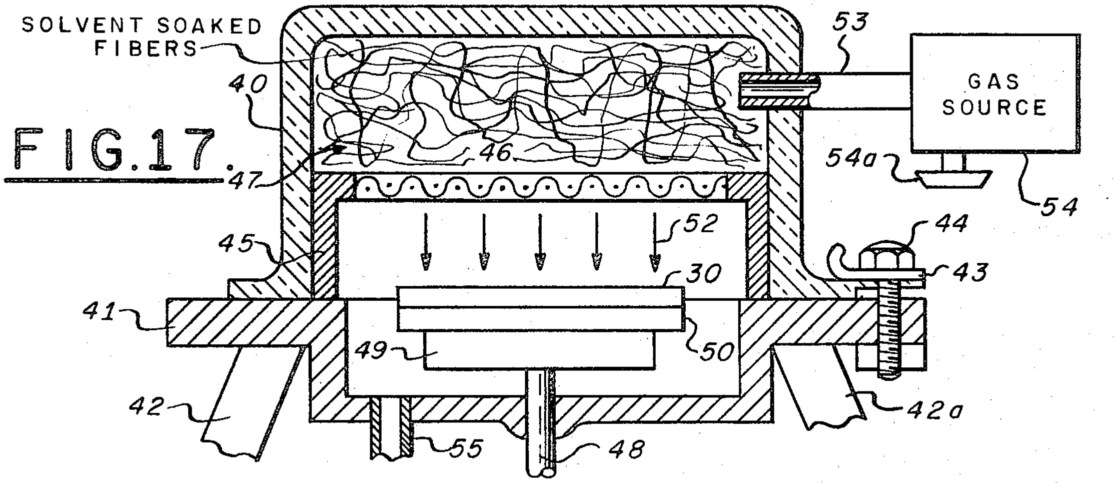
FIG. 17 is a partial cross section view in elevation of apparatus for accomplishing the novel photoresist application method.

The preferred apparatus and method for generating the relatively even photoresist layer 30 of FIG. 15 is shown in FIG. 17. The operation is performed in a glass bell jar 40 fastened to a conventional base platform 41 supported in a convenient location by frame or support elements 42, 42*a*. Bell jar 40, when in use, may be held against the upper surface of base platform 41 by fasteners such as clip 43 and bolt 44. Bell jar 40 contains a fitted metal cylinder 45 which, when in use, rests on the upper surface of base platform 41; the upper circular surface of cylinder 45 is replaced by a screen 46 for supporting above it wads 47 of glass wool. In the region of wads 47, an inlet tube 53 is connected to a gas source 54, gas flow from which may be controlled by valve 54*a* for flow through bell jar 40 and out through exit tube 55. The system is further supplied with a conventional chuck 49 supported for rotation by a motor (not shown) on shaft 48.

In practice, a representative volume for bell jar 40 is on the order of one liter and about one eighth of that volume is occupied by the glass wool wads 47. Wads 47, in such a circumstance, may be soaked with the solvent of the photoresist material (a total of about 25 to 40 c.c. of xylene). The semiconductor body 50, which may contain 50 to 200 diode elements, is engaged to the upper surface of chuck 49 by a vacuum drawn through a hole in shaft 48. The photoresist fluid is applied to the upper surface of body 50 to form layer 30. The bell jar 40 containing the xylene vapor is placed over the base platform 41. Dry air or dry nitrogen is permitted to flow at a low velocity through valve 54*a* and wads 47 in the sense of arrows 52 to encourage downward flow of xylene vapor. Excess photoresist fluid from layer 30 is spun off by rotating the chuck 49 for about five seconds at about 3,000 r.p.m., then the chuck 49 is declutched and stopped, the semiconductor body 50 being allowed to remain stationary for 30 to 60 seconds before bell jar 40 is opened. During the stationary period, the photoresist layer 30 is exposed to relatively concentrated xylene vapor, since it is a relatively heavy vapor and tends to flow downward from wads 47 in the sense of the arrows such as arrow 52. During this exposure, it is found that the photoresist fluid becomes quite evenly distributed, as in FIG. 15, by virtue of the considerably reduced rate of drying made available by the novel method. Where the new method has not been used, the active mesa 6 is found to vary in width by a factor of two and more, with the thinnest part of the mesa sometimes being entirely etched away during the subsequent silicon etch.

Figure 18:
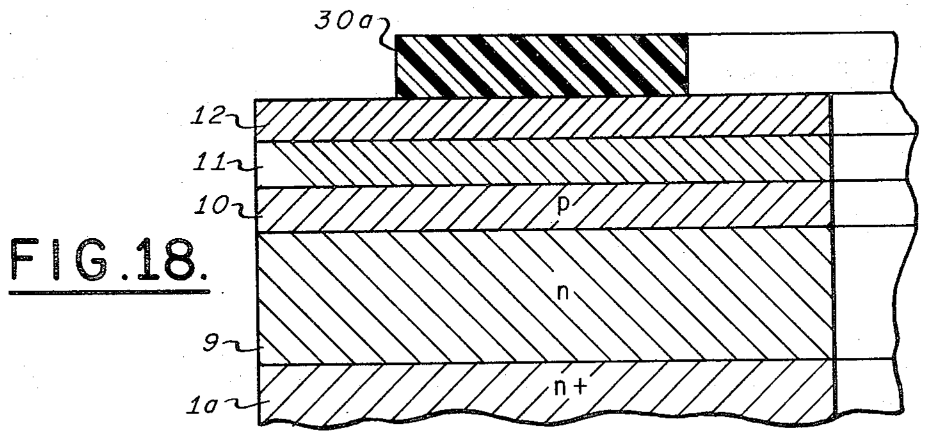
FIGS. 18, 19, 20 and 21 are partial cross sectional elevation views useful in explaining additional steps for completing manufacture of the novel diode of FIG. 1.
Figure 19:
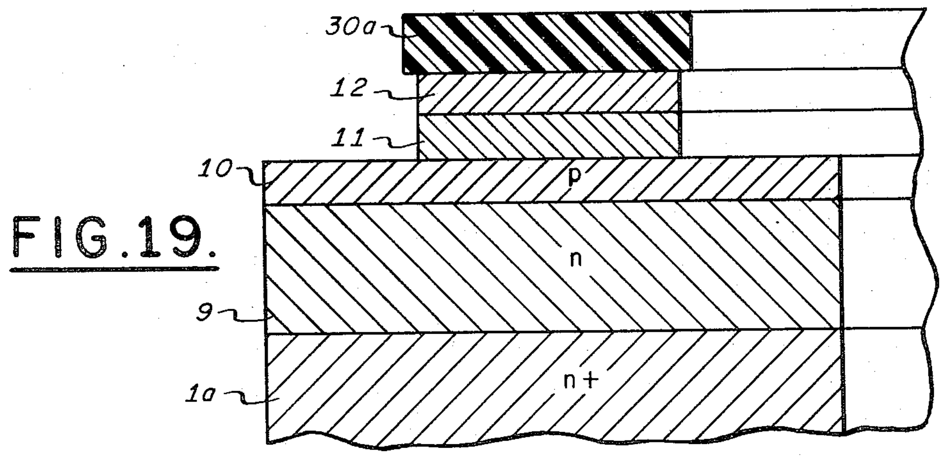

After formation of the very uniform photoresist layer 30 as shown in FIG. 15, it receives the usual photographic treatment such as is conventionally used to convert it into an appropriate mask. As seen in FIG. 18, which shows only the upper part of FIG. 11 on an enlarged scale, the resultant annular photoresist mask 30*a* resides on the upper surface of the annular gold layer 12. A gold etch, followed by a chromium etch as used previously in forming the structure of FIG. 7 is next employed, yielding the structure of FIG. 19, in which the respective annular gold and chromium ring layers 11 and 12 are slightly undercut with respect to photoresist ring 30*a*. Next, by using a conventional silicon etch only on the upper portion of the semiconductor material, the active mesa 6 is completed, as in FIG. 20, being formed on the top annular surface of the capacity reducing mesa 5.

Figure 12:
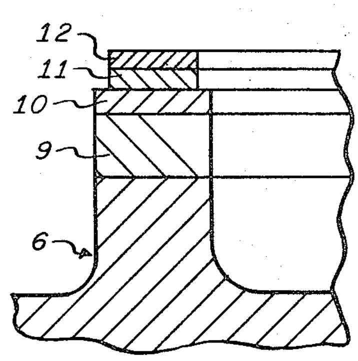
FIGS. 12 and 13 show unsatisfactory structures produced if the novel method of the present invention is not employed.
Figure 13:
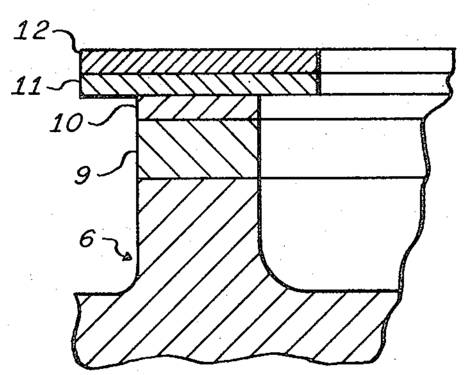
Figure 21:
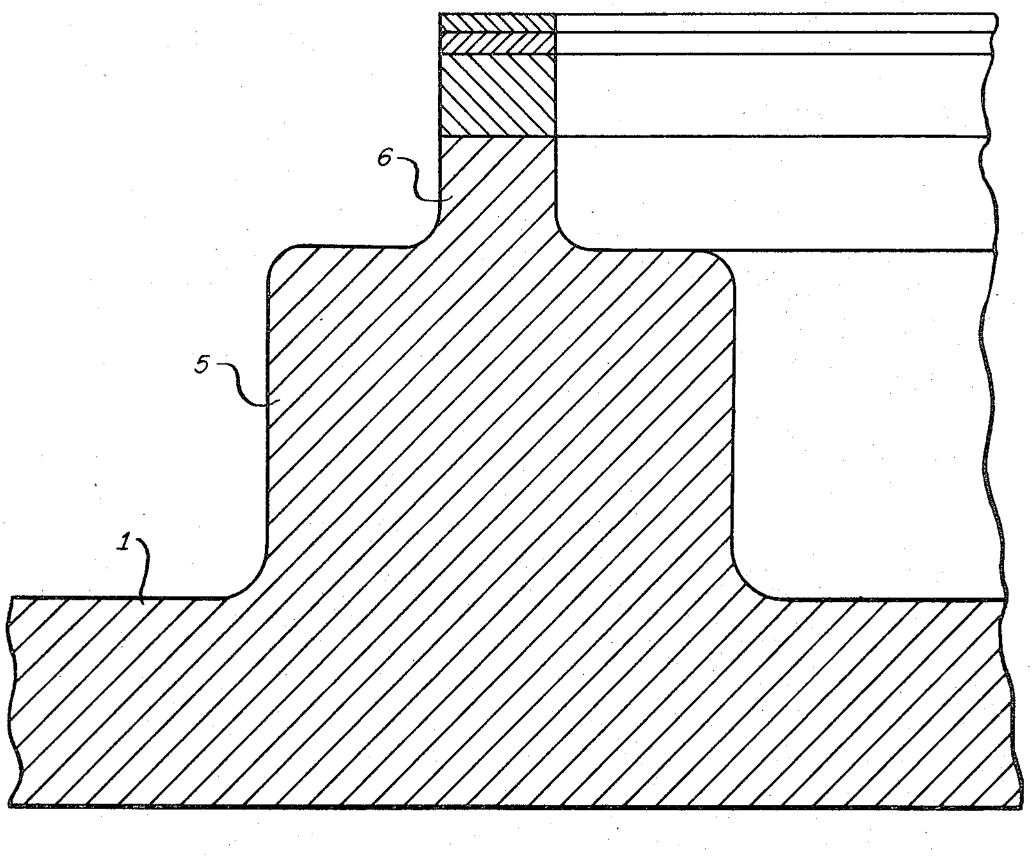

The overhang of metal layers 11 and 12 is eliminated as previously discussed. As previously noted, it is desirable to construct the ring layers 11 and 12 with minimum undesirable undercutting or overhang of the rings such as respectively illustrated in FIGS. 12 and 13. Either overhang or undercut of the final ring layers 11, 12 is detrimental. If the ring layers 11, 12 are undercut as FIG. 12, flow of heat from the active diode junction is seriously impaired according to the degree of undercut, the thermal resistance of the device being increased. Any overhanging parts of ring layers 11, 12, as in FIG. 13, can be undesirably bent in various ways during subsequent handling steps, especially during bonding, or later by action of an electric field placed across the diode during its operation. Damaging short circuits may result. In addition, it has been observed that exposed parts of the etched chromium layer 11 may actually flake off of the layer under the action of an operating electrical field. Such metal flakes may cause intermittent short circuits that ultimately lead to destruction of the diode. The desired final structure has the appearance of FIG. 21.

Figure 22:
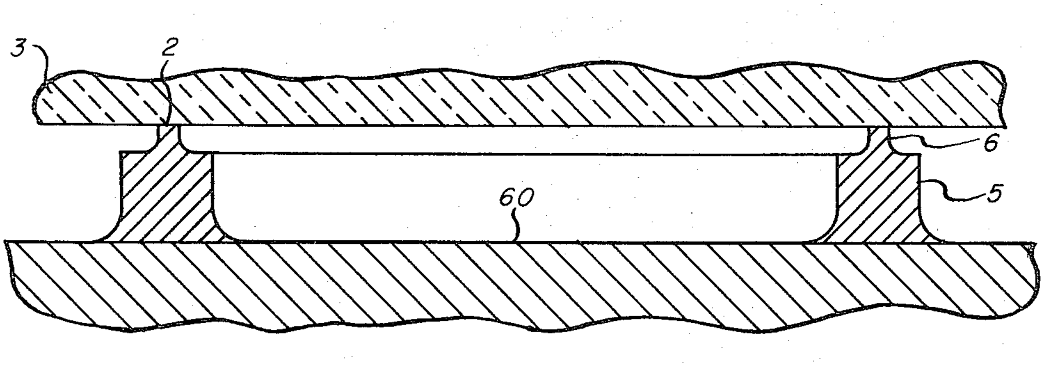
FIG. 22 is an elevation view in cross section of a novel diode structure alternative to that of FIG. 1.

An alternative to the described diode structure also provides the desired low capacitance double-mesa structure and, in addition, affords desirable low parasitic resistance characteristics. The configuration of FIG. 22 is alternative to that of FIG. 1 and, like the FIG. 1 structure, permits both convenient and reliable thermal compression bonding to a heat sink 3 and high efficiency device operation. FIG. 22 again does not show certain interior details that are yet to be discussed as a matter of convenience in simplifying the drawing, especially in connection with the structure of the active mesa 6. In FIG. 22, it is seen that the annular diode comprises a ring shaped semiconductor structure again having the respective active and capacity reducing mesas 6 and 5 and a cooperating heat sink 3. A base plate 60 is made of a conducting material such as gold and now replaces major portions of the semiconductor body of FIG. 1.

The fact that plate 60 has an integral central metal region covering the interior of the annular mesa ring structure 5, 6 makes subsequent thermal compression bonding easy to accomplish, as will be seen. Furthermore, in fabricating the device incorporating metal plate 60, the degree of extension of the plate 60 past the periphery of mesa 5 is readily controllable. Relatively large extensions, even when a low resistivity semiconductor material is used for body 1, may seriously reduce the efficiency of the operating diode. For example, an extension of semiconductor material as great as 15 mils has been demonstrated to reduce the efficiency of typical TRAPATT diode oscillators from 25 to 4 percent. It is believed that such reductions in efficiency arise in the prior art because of high frequency current losses associated with the resistance of the semiconductor material and because high frequency currents must flow mainly on the surfaces of the materials of the diode. In a representative example of the structure shown in FIG. 22, the active mesa 6 is about 8 microns in height and the second mesa 5 is 2 mils high. The gold plate 60 is about 3.5 to 4 mils thick.

Figure 23:
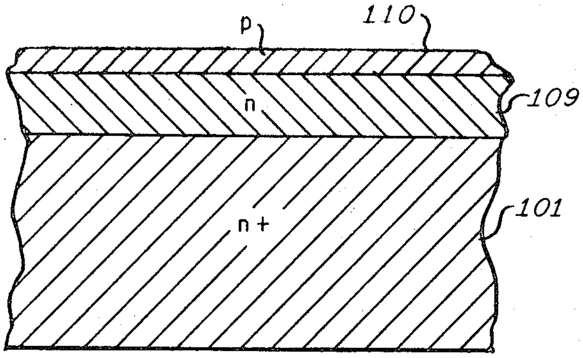
FIGS. 23 to 27 are views similar to those of FIGS. 3 to 11 for use in explaining the method of fabrication of the mesa structure of FIG. 22.

The manufacture of the novel diode of FIG. 22 is begun as in FIG. 23, where parts similar to those of preceding figures bear similar reference numerals with one hundred added to them, such as the type N+ layer 101 mesa, type N layer 109, type P layer 110, the chromium layer 111, and the gold layer 112. It is also to be recognized that the scale and actual dimensions shown are again for illustrative purposes, being purposely exaggerated for convenience in making the drawings clear.

Figure 24:
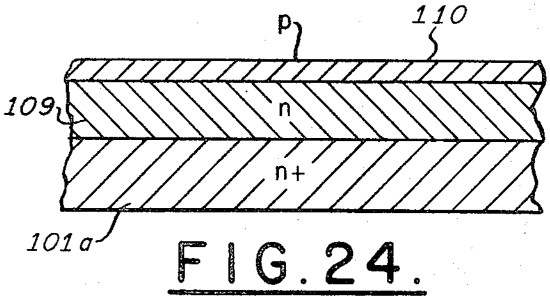

Manufacture is started as in FIG. 23 by operating on a silicon body 101 of the N+ type having a type N epitaxial layer 109 by forming a diffused type P layer 110, the process beginning by the use of a conventional method of diffusing a dopant such as boron into the epitaxial layer to form the type P surface layer 110. As in FIG. 24, the N+ silicon body 101*a* is then thinned to a uniform thickness of about 2 mils by using any one of the several conventional processes known in the art for the purpose, such as by etching or mechanical grinding and polishing or a combination of such methods. In practice, the thickness of the N+ silicon body 101*a* in FIG. 24 may be substantially equal to the desired height of the final active mesa plus the capacitance reducing mesa.

Figure 25:
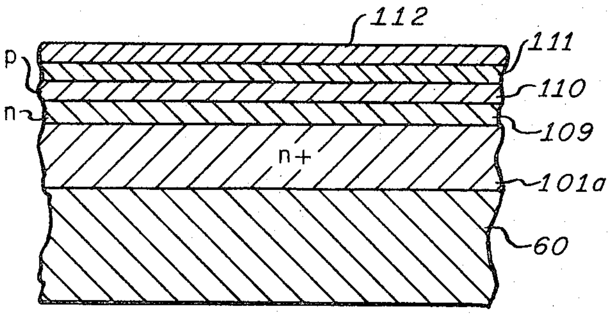

Immediately after the thinning of the silicon to form body 101*a*, a layer 60 of gold or the like is formed on silicon body 101*a* by electroplating or by other convenient plating methods. The gold layer 60 is allowed to grow as in FIG. 25 to between 3 and 4 mils in thickness. The gold layer 60 serves to overcome the prior art difficulties mentioned above, and also serves an an excellent mechanical support for the thin and relatively fragile semiconductor mesa structure during subsequent manufacturing steps, such as photoresist masking, etching, and thermal compression bonding steps. The fabrication of the gold layer 60 may precede or follow the laying down of chromium layer 111 and of gold layer 112, which layers 111, 112 are established in a manner similar to layers 11 and 12 of FIG. 4.

Figures 5, 6:
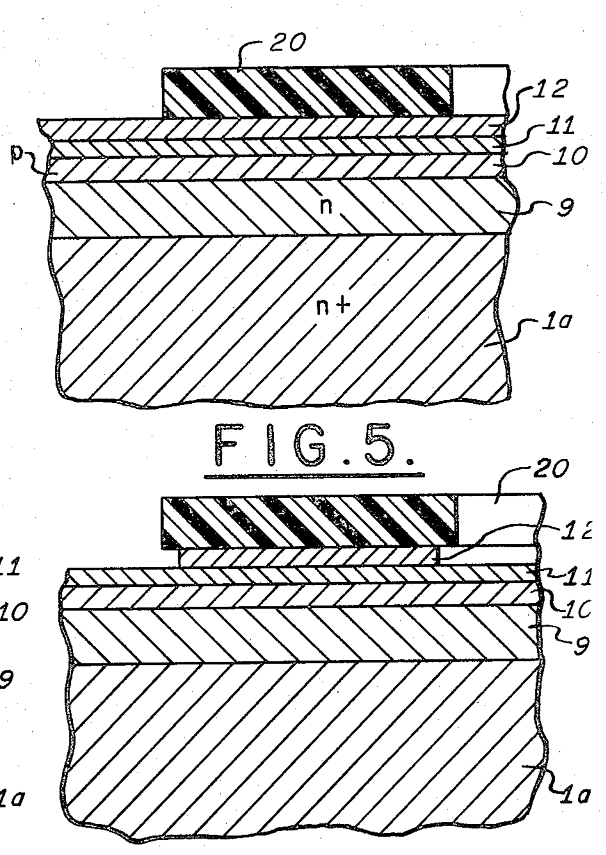

In the alternative embodiment being discussed, the capacity reducing mesa 5 is produced before the active mesa 6 is generated (FIG. 22). For that purpose, the relatively wide ring photoresist mask generally like mask 20 of FIG. 5 is formed on the upper surface of gold layer 112, and a series of steps like those described in connection with FIGS. 6 through 11 is performed. A conventional silicon etching process is finally performed to yield the structure of FIG. 26, this etch being a deep one, removing all of the semiconductor material from the interior of the ring mesa, and exposing the upper surface of gold plate layer 60 in that interior and at the periphery 65 of the mesa. This first silicon etching process defines the shape of the mechanically strong large or capacity reducing mesa 105.

Figure 27:
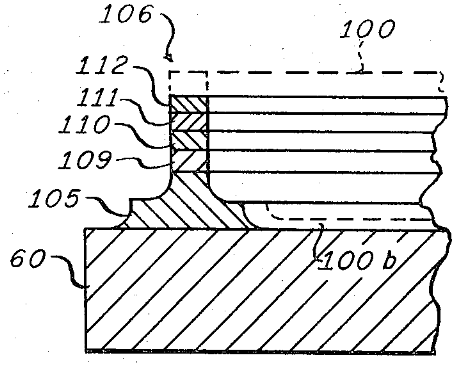
Figure 26:
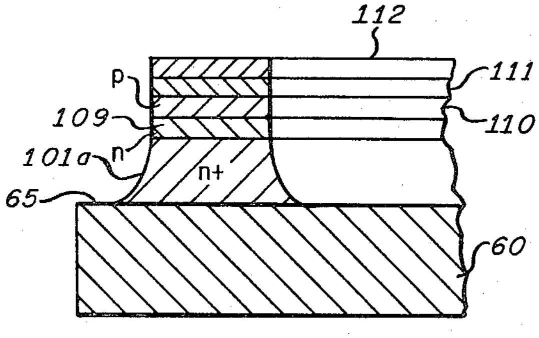

To make the active mesa 106, a photoresist layer is used to mask parts of the FIG. 26 structure that are not to be etched, leaving only the unmasked upper parts and the sides of the mesa generated in FIG. 26 exposed to etchant, including the upper part of N+ mesa layer 106. The series of steps illustrated in FIGS. 5 to 11 may be repeated, yielding an active mesa of narrowed dimensions as in FIGS. 22 and 27, these steps being employed in such a manner as to prevent overhang and undercutting of the respective chromium and gold layers 111, 112, as before. After the photoresist masks are removed, the individual diodes in the array may be mechanically separated when the gold plate layer 60 is scribed or etched or both in the usual manner and are then ready for actual use.

According to another aspect of the invention, superior thermal compression bonds are made at junction 2 of the structure of FIGS. 1 or 22 with a heat sink, preferably of diamond, though other good heat conducting materials may be used. As in FIG. 2, the diamond material of the heat sink 3 is first coated by evaporation, for example, with a thin film 14 of chromium which is found to adhere very tightly to the surface of diamond. The diamond surface is ground flat and prepared for the chromium deposition by washing it in hot sulfuric or chromic acid, followed by a succession of rinses with pure water and final drying. The chromium layer 14 is then applied by evaporation to a depth of less than 50 to 100 Angstroms. The gold layer 13 may be formed next also by evaporation, and is made about 3,000 Angstroms thick, being firmly bonded to chromium layer 13. It is found to be desirable, but not absolutely necessary, that the chromium layer 14 have excellent adhesion to the diamond in order subsequently to form a good thermal compression bond; unexpectedly, it has been discovered that the use of the chromium and gold layers on diamond with the novel thermal compression bonding procedure yet to be described improves the chromium-diamond bond. When the bonding pressure has been applied, it is found that the adhesion of the evaporated chromium film 14 to the diamond is thereby increased considerably. The method of coating the diamond and thermal compression bonding has produced mechanically strong bonds where breaking forces are realized as high as 20,000 pounds per square inch for gold-to-gold bonds.

Figure 28:
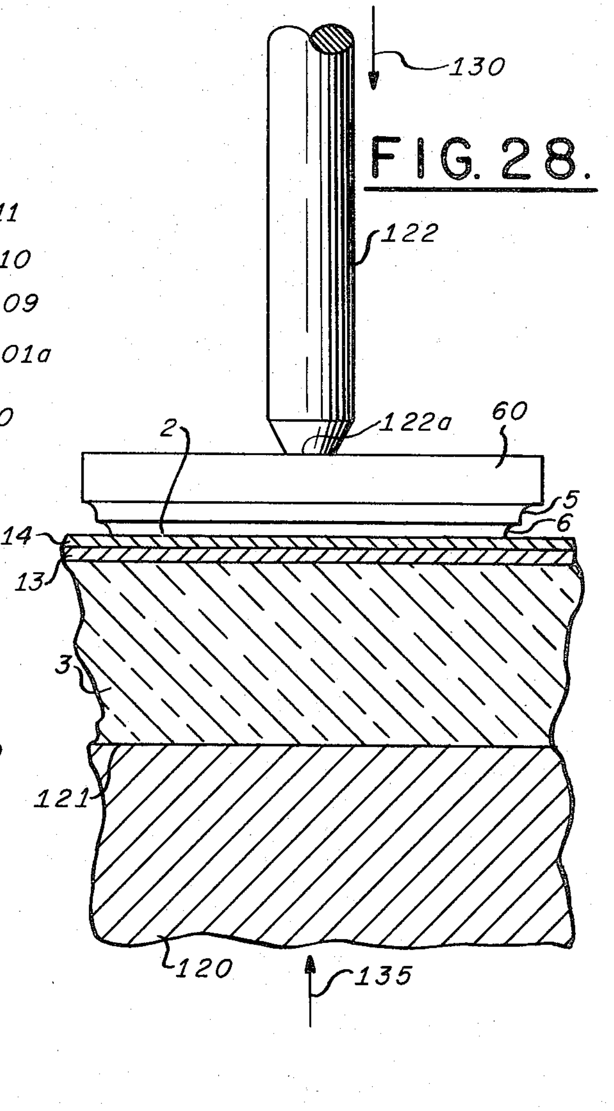
FIG. 28 is an elevation view, partly in cross section, of thermal compression bonding apparatus for explaining its operation according to the invention.

In completing the diode structure according to the novel invention, the diamond heat sink 3, as is seen in FIG. 28, will have been affixed at surface 121 to a relatively massive metal base heat sink element 120. A conventional process will suffice to form the permanent bond at interface surface 121. Conventional methods successfully employ soldering of a metallized surface of the diamond to the metal base 120, but are not satisfactory for forming the bond at surface 2, as previously noted.

Figure 20:
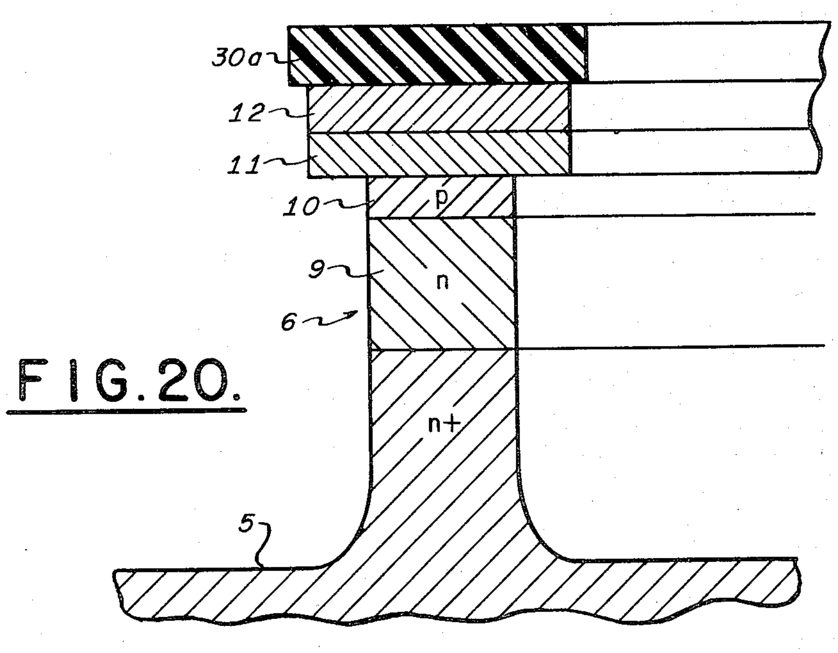

The diamond heat sink 3 is placed with its metal base 120 on the platform of a generally conventional precision press, as shown in FIG. 18, and the structure of FIGS. 1 or 20 is placed on top of the diamond body 3 after metal layers 13 and 14 are applied to it. The force that accomplishes the bonding must be applied so as to ensure even pressure over the entire ring surface 2. If even pressure is not applied, a uniform thermal compression bond will not be formed. Accordingly, the bonding pressure face **122*a* of FIG. 28 of the pressure applying tool 122 is placed over the geometric center of ring 2. Since the gold layer 60 can pivot to a large degree about face 122*a*, correct alignment of the surfaces to be bonded at ring 2 occurs automatically. In order to achieve the correct alignment required for perfect thermal compression bonding, it is advantageous that the backing element is in the form of the permanently integrated plate 60. The 3 to 4 mil thick gold plate 60** readily serves this purpose, being easily strong enough to distribute the bonding forces.

Details of the press used in the bonding step need not be supplied here, since commercially available hydraulic or other presses, equipped with standard force gauging or control instruments, are adequate for the purpose. When the thermal compression bonding process is carried out according to the novel method, bonding pressures as represented by arrow 130 as high as 60,000 pounds per square inch may be applied successfully to silicon devices without damaging them, as opposed to the 20,000 maximum limit commonly imposed when prior art methods are used. Highly reliable and uniform thermal compression bonds with minimum risk to both device and quality of the bond can be accomplished at pressures as low as about 30,000 pounds per square inch. The desired gold layer thermal bonding temperature (275° to 350° Centrigrade) is supplied by placing the diode device within a conventional heater of the type known in the art as a heat column, so that heat flows into heat sink layers 120 and 3 in the sense of arrow 135 and thus to the junction 2 to be bonded. Automatically controlled heaters may be employed which conventionally control the temperature at junction 2 so that it lies in the range from 300° to 320° Centrigrade, thus ensuring that high quality bonds are regularly formed.

While the invention has been described in its preferred embodiments, it is to be understood that the words which have been used are words of description rather than of limitation and that changes within the purview of the appended claims may be made without departure from the true scope and spirit of the invention in its broader aspects.

We claim:

1. A high frequency diode comprising:
- a substrate having at least one surface,
- a first annular semiconductor mesa projecting from said one surface,
  - said first mesa having a first ring shaped surface substantially parallel to said one surface,
- a second annular semiconductor mesa smaller than said first mesa projecting from said first ring shaped surface,
  - said second mesa having a second ring shaped surface substantially parallel to said one surface, and
- heat sink means bonded to said second ring shaped surface.

2. Apparatus as described in claim 1 wherein said heat sink means comprises:
- diamond heat sink means having a surface,
- a metal layer of chromium plated on said diamond heat sink means surface, and
- a layer of high heat and high electrical conductivity metal plated on said chromium layer for thermal compression bonding to said second ring shaped surface.

3. Apparatus as described in claim 2 wherein said layer plated on said chromium layer consists of gold.

4. Apparatus as described in claim 1 wherein said substrate consists of gold.

5. Apparatus described in claim 1 wherein said substrate consists of type N+ semiconductor material.

6. Apparatus as described in claim 1 wherein said first mesa consists of type N+ semiconductor material.

7. Apparatus as described in claim 1 wherein said second mesa consists of:
- a type N+ semiconductor layer affixed to said first mesa first ring shaped surface,
- a type N semiconductor layer affixed to said type N+ layer,
- a type P semiconductor layer affixed to said type N layer,
- a metal chromium layer affixed to said type P layer, and
- a metal layer having high heat and electrical conductivity characteristics affixed to said chromium layer for thermal compression bonding to said heat sink means.

* * * * *